United States Patent [19]
Hamada

[11] Patent Number: 6,165,873
[45] Date of Patent: Dec. 26, 2000

[54] PROCESS FOR MANUFACTURING A SEMICONDUCTOR INTEGRATED CIRCUIT DEVICE

[75] Inventor: Koji Hamada, Tokyo, Japan

[73] Assignee: NEC Corporation, Tokyo, Japan

[21] Appl. No.: 09/447,211

[22] Filed: Nov. 23, 1999

[30] Foreign Application Priority Data

Nov. 27, 1998 [JP] Japan ................... 10-337808

[51] Int. Cl.[7] ................ H01L 21/30; H01L 21/46
[52] U.S. Cl. .............. 438/459; 438/455; 438/458; 257/347; 156/16
[58] Field of Search .................. 438/455, 458, 438/459; 257/347; 156/16

[56] References Cited

U.S. PATENT DOCUMENTS

| | | | |
|---|---|---|---|
| 3,791,342 | 2/1974 | Boyer et al. ................ | 118/52 |
| 3,930,914 | 1/1976 | Hetrich .................... | 156/16 |
| 5,256,599 | 10/1993 | Asetta et al. ............. | 437/225 |
| 5,304,509 | 4/1994 | Sopori . | |
| 5,543,648 | 8/1996 | Miyawaki ................. | 257/347 |
| 5,744,401 | 4/1998 | Shirai et al. . | |
| 5,773,354 | 6/1998 | Hashimoto ............... | 438/459 |
| 5,876,497 | 3/1999 | Atoji ...................... | 117/85 |
| 6,008,110 | 12/1999 | Samata et al. ............ | 438/459 |

FOREIGN PATENT DOCUMENTS

| | | |
|---|---|---|
| 4-287365 | 10/1992 | Japan . |
| 9-64194 | 3/1997 | Japan . |
| 10-223884 | 8/1998 | Japan . |

OTHER PUBLICATIONS

"Optimizing Polysilicon Thin–Film Transistor Performance with Chemical–Mechanical Polishing and Hydrogenation," Alice B. Y. Chan, et al., *IEEE Electron Device Letters*, vol. 17, no. 11, Nov. 1996, pp. 518–520.

"Highly Efficient, Large–Area Polycrystalline Silicon Solar Cells Fabricated Using Hydrogen Passivation Technology," Kunihiro Matsukuma, et al., *Japanese Journal of Applied Physics*, vol. 28, No. 2, Feb. 1989, pp. 167–173.

*Primary Examiner*—John F. Niebling
*Assistant Examiner*—Viktor Simkovic
*Attorney, Agent, or Firm*—Sughrue, Mion, Zinn, Macpeak & Seas, PLLC

[57] ABSTRACT

This invention relates to a process for manufacturing a semiconductor integrated circuit device comprising hydrogen annealing where a silicon substrate on which a device structure is formed and an interlayer insulating film is deposited is annealed in an atmosphere of hydrogen, comprising removing a substrate material on a substrate surface opposite to the surface on which a device structure is formed (substrate rear face), to make the substrate thinner before the hydrogen annealing; and processing the rear face for removing damages due to crystal defects and scratches generated on the rear face. According to this invention, hydrogen annealing can improve device properties and reliability, regardless of a device structure on the substrate surface, and a semiconductor integrated circuit device can be manufactured in a higher yield.

19 Claims, 5 Drawing Sheets

PROCESS FOR MANUFACTURING A SEMICONDUCTOR INTEGRATED CIRCUIT DEVICE

BACKGROUND OF THE INVENTION

1. Field of the Invention

This invention relates to a process for manufacturing a semiconductor integrated circuit device. In particular, it relates to a hydrotreating process for improving device properties and reliability.

2. Description of the Related Art

In a conventional process for manufacturing a semiconductor integrated circuit device such as a memory and a logic, a variety of device structures are formed on a substrate, an interlayer insulating film is deposited and then the product is hydrogen-annealed at about 400° C. in an atmosphere of hydrogen.

The hydrogen-annealing is conducted for improving electric connection properties between metal lines or between a silicon substrate and a metal line, improving device properties and reliability, and improving an yield during the manufacturing process, and thus, is a very important treatment in manufacturing a semiconductor integrated circuit device.

For example, in a DRAM, there exists an interface state between a silicon oxide film (e.g., a device-isolating oxide film and a gate oxide film) and a silicon substrate. Via this interface state, a leak current passes from a diffusion layer to the substrate, which causes deterioration in hold properties of the DRAM. Furthermore, such an interface state causes variation of transistor properties such as a threshold voltage and current-voltage properties, leading to their deviation from design limits. It, therefore, leads to a poor yield of a reliable semiconductor integrated circuit device.

It is believed that an interface state which may cause such various problems may be formed due to a dangling bond in silicon near an interface between a silicon oxide film and a silicon substrate. Hydrogen annealing may supply hydrogen to the interface, and the hydrogen can terminate the dangling bond, which leads to reduction in interface states.

Thus, since hydrogen annealing can stabilize transistor properties such as a threshold voltage and current-voltage properties, it has been also used for a semiconductor integrated circuit other than a DRAM such as a logic.

However, a semiconductor integrated circuit device has become increasingly finer, more compact and more multi-layered. In addition, new types of multilayer structure, electrode or electric-line material and insulating material have been increasingly utilized. It has been, therefore, difficult to allow hydrogen to sufficiently penetrate to and diffuse in a target interface by hydrogen annealing. Thus, annealing must be conducted for a longer period at a higher temperature. However, a longer annealing period may reduce productivity. Furthermore, since hydrogen annealing must be conducted in a final manufacturing stage after forming metal lines such as an aluminum line, an excessively higher temperature may lead to poor reliability due to spikes and/or hillocks in a metal line material such as aluminum.

Permeability of hydrogen varies depending on constituents in a semiconductor integrated circuit device, Specifically, hydrogen can penetrate a silicon oxide film such as an interlayer insulating film and a device-isolating insulating film, while not substantially penetrating a silicon nitride film which is frequently used as, for example, an etching stopper, a capacitor insulating film or an anti-contamination film. In particular, a silicon nitride film formed by a low pressure CVD process may act as a diffusion barrier to hydrogen because of its quite dense structure. A metal line material such as aluminum, a barrier metal material such as Ti and TiN and a polycrystalline silicon used for a variety of lines or electrodes can absorb and consume hydrogen. Thus, although hydrogen can penetrate them after reaching a saturation absorption, a diffusion rate may be significantly reduced.

Next, infiltration of hydrogen from the rear face of a substrate will be discussed. As a wafer aperture has become larger, a wafer has become thicker; for example, a thickness is 675 $\mu$m for a 6 inch substrate, 725 $\mu$m for an 8 inch substrate and more than 770 $\mu$m for a 12 inch substrate. Such increase in a thickness means increase of a diffusion distance for hydrogen, which makes it difficult for hydrogen to diffuse from the substrate rear face. Furthermore, during forming a polycrystalline silicon film or silicon nitride film in a device formation process on a substrate surface, there may be also formed or deposited a barrier film to hydrogen diffusion on the rear face, which inhibits infiltration of hydrogen from the rear face. In some cases, a polycrystalline silicon film is intentionally formed on a substrate rear face for EG (Extrinsic Gettering). As discussed above, it is difficult for hydrogen to infiltrate from a substrate rear face, and furthermore, a longer diffusion distance after infiltration may require hydrogen annealing at a higher temperature for a longer period.

With reference to a specific device structure, it will be described that hydrogen annealing has become difficult in a recent device structure.

FIG. 1 shows a plan view and cross sections for an exemplary stack type of DRAM. In this structure, a device-isolating film 2 is formed on a P-type silicon substrate 1 having a given crystal orientation. On the substrate, there is formed a gate insulating film 4 (a silicon oxide film), on which is formed a gate electrode 3 consisting of an N-type polycrystalline silicon film and a tungsten silicide film (unshown) on which a silicon nitride film 6 is deposited. An N-type diffusion layer 5 is formed, which is self-aligned to the device-isolating film and the gate electrode. A silicon nitride film 6 is formed on the side wall of the gate electrode. There is formed a pad 9 consisting of an n-type polycrystalline silicon between the gate electrodes by an anisotropic selective epitaxial growth technique. On these elements, there is deposited an interlayer insulating film 7 in which a contact hole reaching the upper surface of the n-type polycrystalline silicon pad 9 is formed. The contact hole is filled with an N-type polycrystalline silicon, providing a contact 8 electrically connecting with a capacity lower electrode 10. On the capacity lower electrode consisting of an N-type polycrystalline silicon is formed a capacity insulating film 11 consisting of ONO (oxide film-nitride film-oxide film), on which is formed a capacity upper electrode 12 consisting of an N-type polycrystalline silicon. A bit line (unshown) is disposed on the capacity upper electrode, via an interlayer insulating film. A capacity lower electrode 10 is separately formed for each transistor, while a capacity upper electrode 12 is separately formed for each cell array.

In this structure, hydrogen infiltrating by hydrogen annealing is first absorbed by the bit line consisting of the polycrystalline silicon and then absorbed and consumed by the polycrystalline silicon layer constituting the capacity upper electrode 12 formed per a cell array. Then, it reaches an interface between the substrate 1 and the gate insulating film 4 or the device-isolating insulating film 2 via the interlayer insulating film 7. When a bit line is disposed between the capacity lower electrode 10 and the transistor, i.e., a capacitor overbit line (COB) structure, hydrogen can be also absorbed and consumed by a polycrystalline silicon layer constituting the bit line.

Thus, recent tendency to miniaturization and densification have increased a proportion of bit lines and word lines in a unit area and have reduced a distance between cell arrays, which has increasingly made hydrogen annealing difficult.

In particular, in a 16 M type comprising a capacitor underbit line (CUB) structure, there is formed an aperture for contact between a bit line and a substrate diffusion layer, and the aperture is an important diffusion path for hydrogen. However, for a miniaturized 16 M shrink type comprising a COB structure, such an aperture is not necessary. A gap between capacity upper electrodes is a sole diffusion path for hydrogen. A 64 M type or 64 M shrink type is further miniaturized and densified and therefore, a distance between bit lines, between word lines and between capacity lower electrodes is much more reduced.

FIG. 2 schematically shows a cross section for a stack type of DRAM comprising a self-align contact (SAC) structure. In this structure, a silicon nitride film 6 is formed for protecting a gate electrode 3 and a device-isolating film 2 during forming a contact hole, and the silicon nitride film only over the contact is removed before filling the hole. On the other hand, a nitride film is formed or deposited on the substrate rear face during forming the nitride film on the front surface. In such a structure, the substantially whole surface of the substrate is covered by a silicon nitride film which blocks hydrogen. Thus, hydrogen annealing is quite difficult.

FIGS. 3 and 4 show change in a leak current vs a hydrogen annealing time when a silicon substrate having the above structure was hydrogen-annealed by a conventional process, where hydrogen annealing was conducted at 400° C. in an atmosphere of hydrogen/nitrogen (1:1) under an ambient pressure. A leak current was measured while connecting the transistors of all the unit cell blocks in parallel.

FIG. 3 shows measuring results for a stack type of DRAM comprising the structure shown in FIG. 1, indicating that the more densified, i.e, sequentially from (a) a 16 M type comprising CUB structure, (b) a 16 M shrink type comprising COB structure, (c) a 64 M type comprising COB structure to (d) a 64 M shrink type comprising COB structure, the longer time is taken for reducing a leak current and thus the longer period is required for hydrogen annealing.

FIG. 4 shows the measuring results for a 64 M stack type of DRAM (b) comprising an SAC structure together with the results for that (a) not comprising an SAC structure. This figure indicates that for (b) the DRAM comprising an SAC structure, a leak current is not significantly reduced, i.e., hydrogen does not substantially infiltrate or diffuse.

SUMMARY OF THE INVENTION

An objective of this invention is to provide a process for manufacturing a semiconductor integrated circuit device in a higher yield while improving device properties and reliability by hydrogen annealing, regardless of a device structure on a substrate surface.

This invention relates to a process for manufacturing a semiconductor integrated circuit device comprising hydrogen annealing where a silicon substrate on which a device structure is formed and an interlayer insulating film is deposited is annealed in an atmosphere of hydrogen, comprising removing a substrate material on a substrate surface opposite to the surface on which a device structure is formed (substrate rear face), to make the substrate thinner before the hydrogen annealing; and processing the rear face for removing damages due to crystal defects and scratches generated on the rear face.

This invention also relates to a process for manufacturing a semiconductor integrated circuit device comprising hydrogen annealing where a silicon substrate on which a device structure is formed and an interlayer insulating film is deposited is annealed in an atmosphere of hydrogen, comprising removing a substrate material on a substrate surface opposite to the surface on which a device structure is formed (substrate rear face), to make the substrate thinner, without generating damages due to crystal defects or scratches on the substrate surface, before the hydrogen annealing.

According to this invention, hydrogen annealing can improve device properties and reliability, regardless of a device structure on the substrate surface, and a semiconductor integrated circuit device can be manufactured in a higher yield.

DETAILED DESCRIPTION OF THE PREFERRED EMBODIMENTS

Figure 1A:
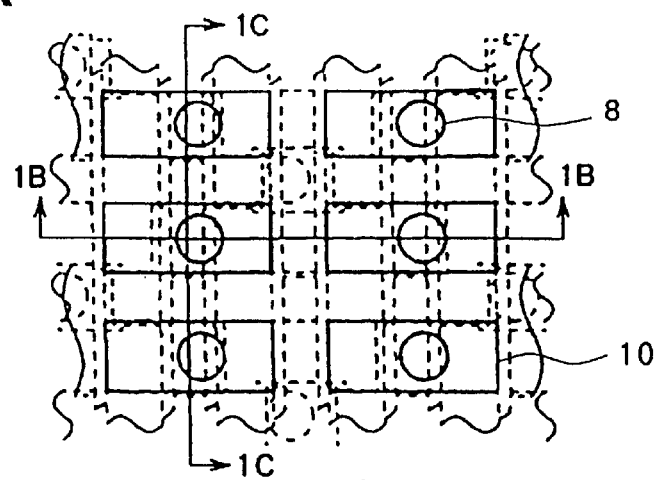
FIGS. 1a–1c shows schematic figures for an example of a stack type of DRAM.

The process of this invention comprises removing a substrate material on a substrate surface (substrate rear face) opposite to the surface on which a device structure is formed and an interlayer insulating film is deposited, to make the substrate thinner before hydrogen annealing; and processing the rear face for removing damages due to crystal defects and scratches generated on the rear face. Alternatively, this invention comprises removing a substrate material on the substrate rear face, to make the substrate thinner, without generating damages due to crystal defects or scratches on the substrate rear face, before the hydrogen annealing.

Removal of the substrate material on the rear face to make the substrate thinner may reduce a diffusion distance for hydrogen from the substrate rear face to a desired substrate interface. It can remove a barrier film to hydrogen diffusion such as a polycrystalline silicon film and a silicon nitride film formed or deposited on the substrate rear face during the device forming step, to facilitate infiltration of hydrogen from the substrate rear face. Furthermore, reducing the substrate thickness to that for a subsequent packaging step can eliminate a conventional step of grinding the substrate rear face for adjusting the substrate thickness before packaging.

In the process of this invention, when removing damages such as crystal defects and scratches after reducing the substrate thickness, the substrate can be thinned by a common technique for thinning a substrate, such as grinding, mechanical polishing, chemical mechanical polishing and sand blasting.

When damages occur such as crystal defects and scratches after thinning the substrate by removing the substrate material on the substrate rear face using any of the above common processes, it is necessary to process the surface for removing the damages by, for example, common wet etching, dry etching or mirror polishing by chemical mechanical polishing. It is preferable to remove the substrate material of 40 μm or over thick for removing damages due to crystal defects and scratches generated on the rear face.

Damages such as crystal defects and scratches, in particular crystal defects, generated on a substrate rear face by grinding or polishing, act as a trap source for hydrogen during hydrogen annealing, and thus trap hydrogen until they are saturated. It, therefore, leads to a longer annealing time to achieve a desired effect. In other words, it may cancel the effect of the substrate thinning step. Thus, by removing the damages such as crystal defects by surface treating according to this invention, hydrogen is not trapped on the substrate rear face and can quickly infiltrate from the rear face. The infiltrating hydrogen can reach a desired substrate interface in a short time because the substrate has been made thinner by the above grinding or polishing to reduce a diffusion distance. In the process of this invention, instead of the above procedure, a substrate can be thinned by such a method that does not generate damages on the substrate rear face, before hydrogen annealing. Specifically, the substrate can be first subject to processing such as wet etching, dry etching and mirror polishing by chemical mechanical polishing, without damages on the surface -to be treated, to be thinned to a desired thickness.

The final thickness of the substrate after a thinning process as described above is preferably from a thickness required during a subsequent packaging step to 550 μm both inclusive, more preferably 300 μm to 500 μm. The substrate thickness within the above limits may allow hydrogen to reach an interface between an oxide film and the silicon substrate in a short time while making a chip thickness appropriate in an assembly step. The thinning step in the process of this invention can, therefore, eliminate a subsequent step of grinding the substrate. That is to say, in the process of this invention, the substrate may be thinned by treating the substrate surface opposite to the surface on which a device structure is formed, to eliminate a step of grinding for adjusting a substrate thickness before packaging.

According to this invention, even when it is difficult for hydrogen to infiltrate and diffuse from a substrate front surface, hydrogen can adequately infiltrate and diffuse from the substrate rear face, permitting hydrogen annealing to be effectively conducted using a conventional procedure under conventional conditions. Even at about 400° C. as in a conventional process, annealing can be effectively conducted in the same as or shorter time than that for the conventional process.

Although we have described in terms of a DRAM, it will be, of course, appreciated that this invention can be applied to a logic comprising multiple DRAMs, and a semiconductor integrated circuit device comprising a silicon nitride over the substantially whole surface of the substrate such as a device comprising a self-align contact structure.

EXAMPLE

This invention will be specifically described with reference to an Example.

Figure 2:
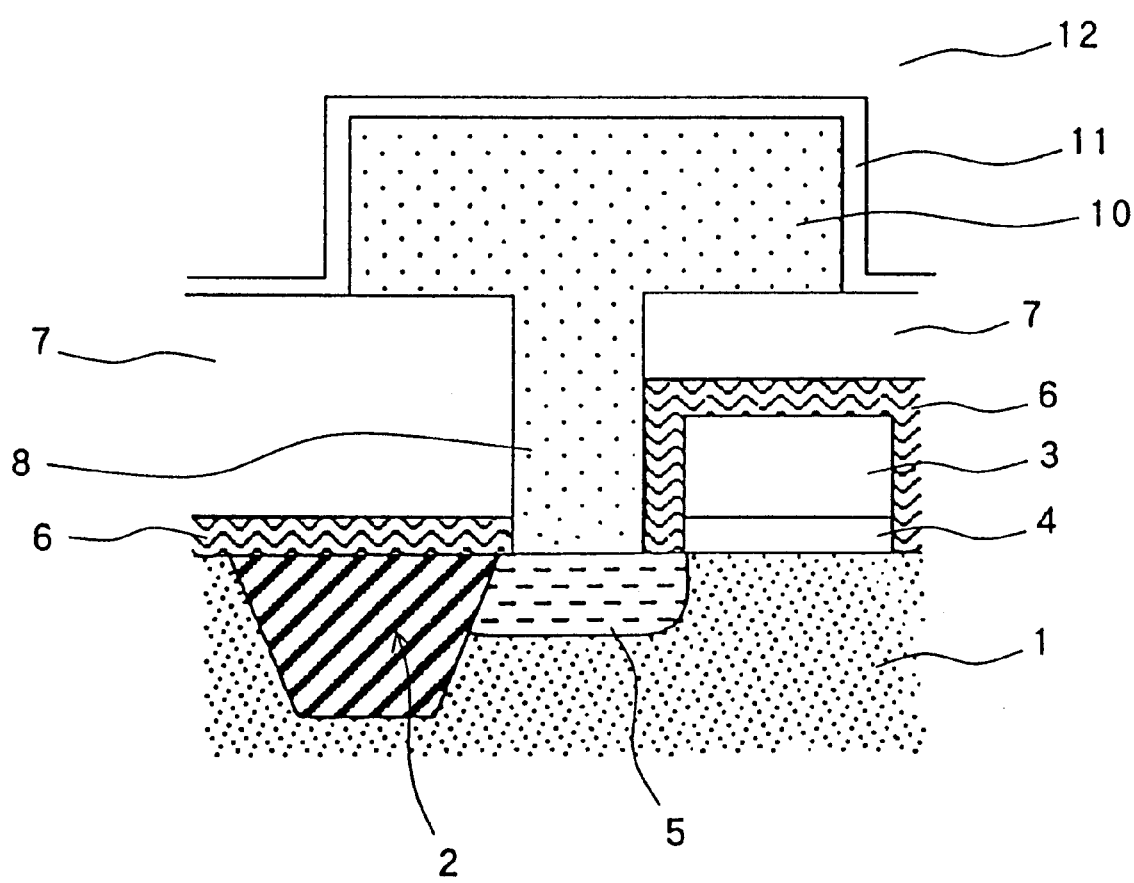
FIG. 2 is a schematic cross section for a stack type of DRAM comprising a self-align contact structure.

In this example, this invention is applied to manufacturing the stack type of DRAM shown in FIG. 2.

In the structure shown in FIG. 2, a device-isolating film 2 is formed on a P-type silicon substrate 1. On the substrate, there is formed a gate insulating film (silicon oxide film) 4, on which is formed a gate electrode 3 consisting of an N-type polycrystalline silicon film and a tungsten silicide film (unshown). An N-type diffusion layer 5 is formed, which is self-aligned to the device-isolating film and the gate electrode. On the device-isolating film and the gate electrode is formed a silicon nitride film 6, on which is deposited an interlayer insulating film 7 consisting of a silicon oxide film. In the interlayer insulating film 7 is formed a contact hole reaching the diffusion layer 5, around which the silicon nitride film is removed. The contact hole is filled with an N-type polycrystalline silicon, providing a contact 8 electrically connecting with a capacity lower electrode 10. On the capacity lower electrode consisting of an N-type polycrystalline silicon is formed a capacity insulating film 11 consisting of ONO (oxide film-nitride film-oxide film), on which is formed a capacity upper electrode 12 consisting of an N-type polycrystalline silicon. A bit line (unshown) is disposed within the interlayer insulating film 7, i.e., a COB structure.

Figure 5:
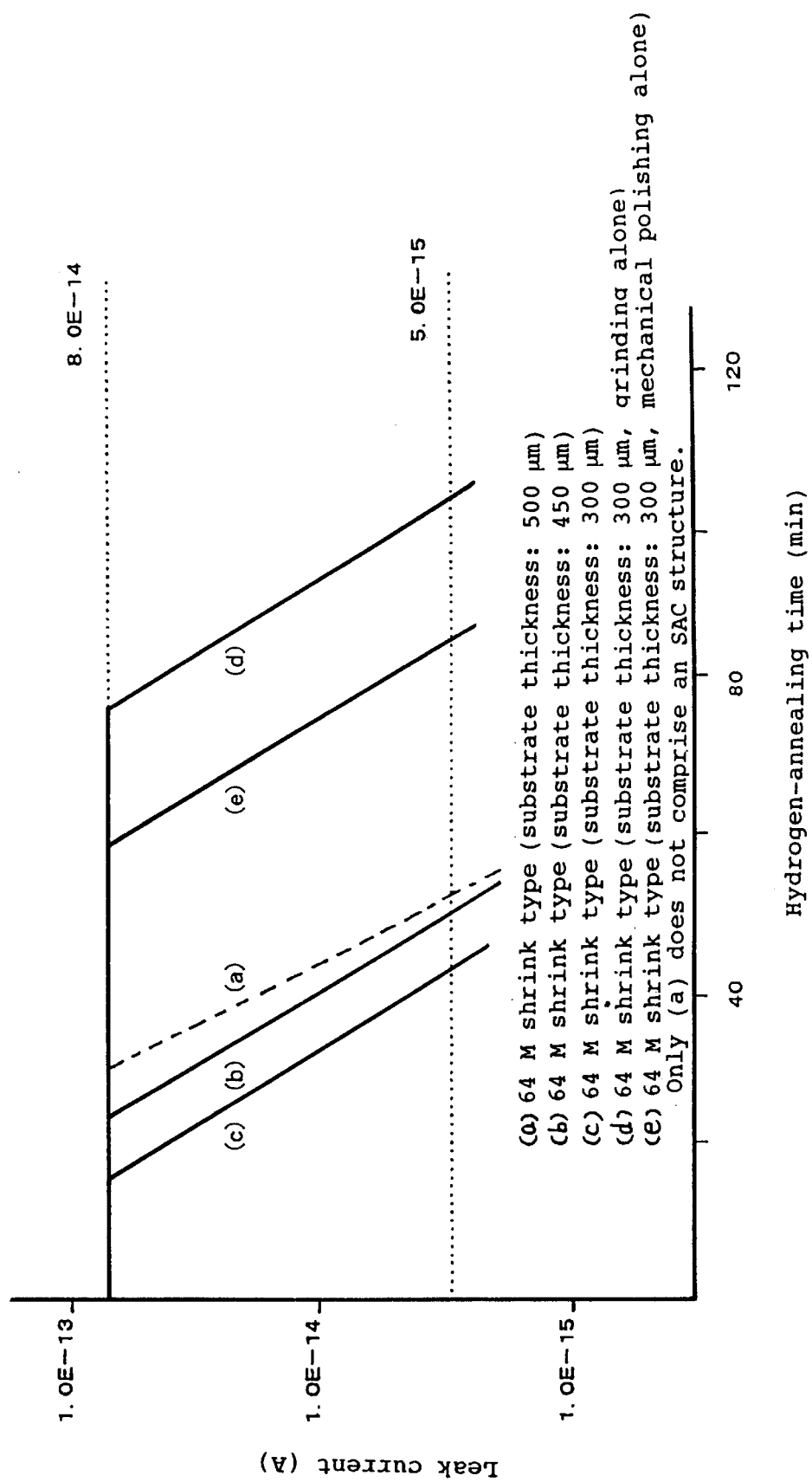
FIG. 5 is a graph change in a leak current vs an annealing time in Example according to the process of this invention together with that for a comparative example.

FIGS. 5 shows change in a leak current vs an annealing time for a 64 M shrink type whose substrate was thinned by the process of this invention. Hydrogen annealing was conducted at 400° C. in an atmosphere of hydrogen/nitrogen (1:1) under an ambient pressure. A leak current was measured while connecting the transistors of all the unit cell blocks in parallel. A measured value was converted to a leak current per a unit transistor.

Figure 1B:
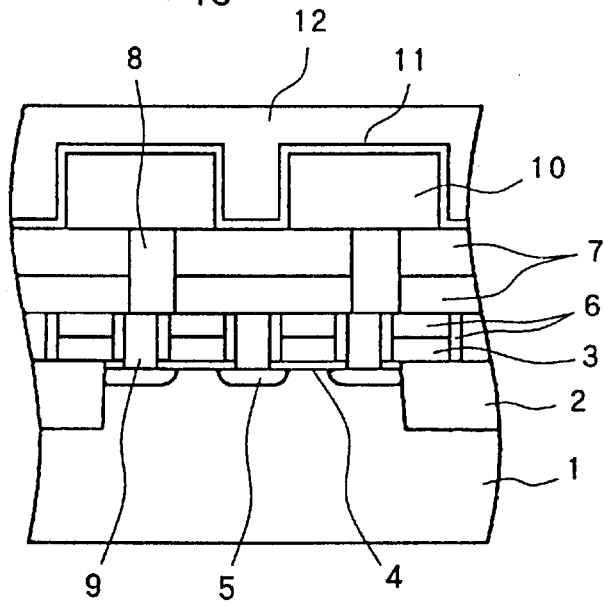
Figure 1C:
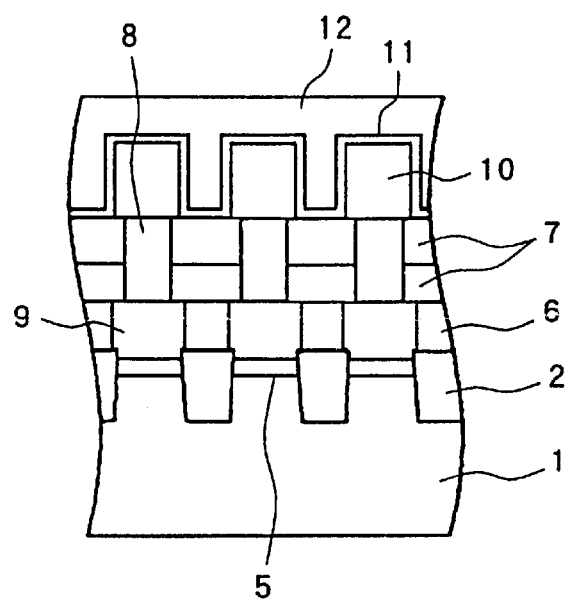

In FIG. 5, (b) and (c) show the results from Example according to this invention, i.e., the results obtained when a substrate having the SAC structure shown in FIG. 2 was ground and then etched to a thickness of 450 μm and 300 μm. respectively. The ground rear face of the substrate was etched in a mixed solution of hydrofluoric acid and nitric acid (50%-HF solution: $HNO_3$=2:1(vol/vol)) for two minutes. The substrate material of about 60 μm thick was removed by the wet-etching. There were obtained similar results when a substrate was thinned by mirror polishing by chemical mechanical polishing alone, instead of grinding and then etching. In FIG. 5, (d) and (e) are the results obtained when a substrate having the SAC structure was thinned to a thickness of 300 μm by grinding or mechanical polishing, respectively. The results in (a) were obtained when a substrate having the structure shown in FIG. 1 which did not have an SAC structure and had its original thickness of 500 μm was hydrogen-annealed after removing a polycrystalline silicon and a silicon nitride on the rear face.

Figure 4:
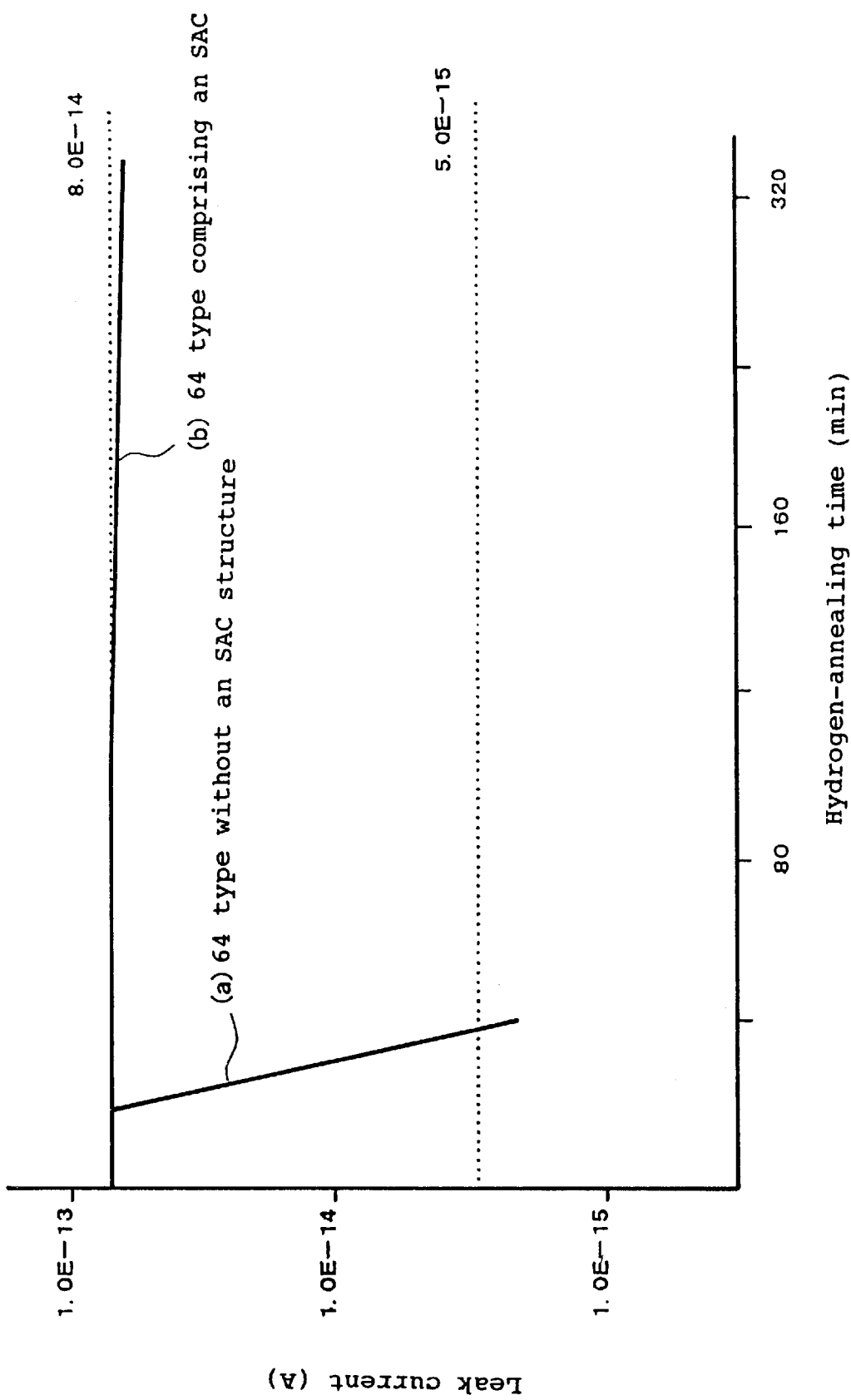
FIG. 4 is another graph showing change in a leak current vs an annealing time according to a conventional process.

As shown in FIG. 4(b), a leak current was not substantially reduced even after 320 min for an unshrinked 64 μtype having an SAC structure, whereas as shown FIG. 5, a leak current was reduced earlier for the types of FIGS. 5(b) and 5(c) according to this invention. In the latter two, a leak current was reduced earlier than the type of FIG. 5(a) without an SAC structure. FIG. 5(c) where the substrate was relatively thinner, indicated leak-current reduction earlier than FIG. 5(b).

On the other hand, for the types of FIG. 5(d) or 5(e), a substrate was thinned by grinding or mechanical polishing alone, respectively, so that there were damages such as crystal defects and scratches on the substrate rear face. They, therefore, exhibited leak-current reduction later than FIGS. 5(b) and (c), indicating a longer hydrogen-annealing time.

Figure 3:
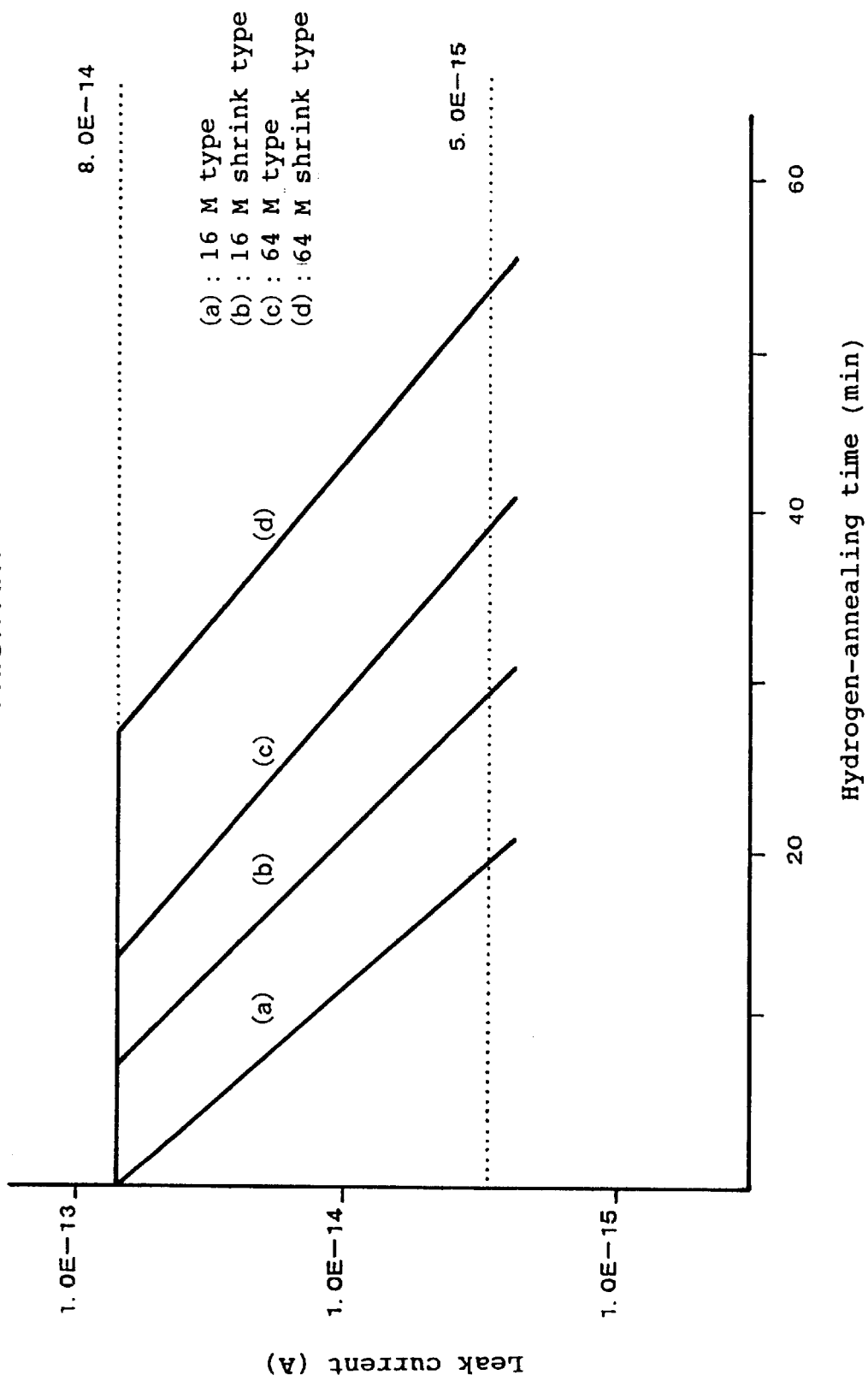
FIG. 3 is a graph showing change in a leak current vs an annealing time according to a conventional process.

FIG. 5(a) shows the results for the type of FIG. 3(d) except that a polycrystalline silicon and a silicon nitride film were etched off to expose the substrate surface before hydrogen annealing. For this type, hydrogen may easily infiltrate from the rear face because a polycrystalline silicon and a nitride film are absent on the substrate rear face. A leak current should have been, therefore, reduced earlier than that of FIG. 3(d). There were, however, observed no differences between FIG. 5(a) and FIG. 3(d). It indicates that hydrogen may be trapped and absorbed by damages on the substrate such as crystal defects and scratches generated by a stress applied to the substrate by a film such as a silicon nitride film having a coefficient of thermal expansion different from that of the substrate, as with crystal defects generated by, e.g., grinding on a substrate crystal surface which can absorb hydrogen. This also indicates that it is important to remove damages such as crystal defects and scratches on an exposed substrate surface.

What is claimed is:

1. A process for manufacturing a semiconductor integrated circuit device comprising hydrogen annealing where a silicon substrate on which a device structure is formed and an interlayer insulating film is deposited is annealed in an atmosphere of hydrogen, comprising removing a substrate material on a substrate surface opposite to the surface on which a device structure is formed (substrate rear face), to make the substrate thinner before the hydrogen annealing; and processing the rear face for removing damages due to crystal defects and scratches generated on the rear face.

2. A process for manufacturing a semiconductor integrated circuit device as claimed in claim 1 where in the step of thinning the substrate, the substrate is thinned by removing the substrate material by grinding.

3. A process for manufacturing a semiconductor integrated circuit device as claimed in claim 1 where in the step of thinning the substrate, the substrate is thinned by removing the substrate material by mechanical polishing.

4. A process for manufacturing a semiconductor integrated circuit device as claimed in claim 1 where in the step of thinning the substrate, the substrate is thinned by removing the substrate material by chemical mechanical polishing.

5. A process for manufacturing a semiconductor integrated circuit device as claimed in claim 1 where in the surface treatment step, the damages are removed by etching.

6. A process for manufacturing a semiconductor integrated circuit device as claimed in claim 5 where the damages are removed by dry etching.

7. A process for manufacturing a semiconductor integrated circuit device as claimed in claim 5 where the damages are removed by wet etching.

8. A process for manufacturing a semiconductor integrated circuit device as claimed in claim 1 where in the surface treatment step, the damages are removed by mirror polishing by chemical mechanical polishing.

9. A process for manufacturing a semiconductor integrated circuit device comprising hydrogen annealing where a silicon substrate on which a device structure is formed and an interlayer insulating film is deposited is annealed in an atmosphere of hydrogen, comprising removing a substrate material on a substrate surface opposite to the surface on which a device structure is formed (substrate rear face), to make the substrate thinner, without generating damages due to crystal defects or scratches on the substrate surface, before the hydrogen annealing.

10. A process for manufacturing a semiconductor integrated circuit device as claimed in claim 9 where in the step of thinning the substrate, the substrate is thinned by removing the substrate material by etching.

11. A process for manufacturing a semiconductor integrated circuit device as claimed in claim 10 where the substrate is thinned by removing the substrate material by dry etching.

12. A process for manufacturing a semiconductor integrated circuit device as claimed in claim 10 where the substrate is thinned by removing the substrate material by wet etching.

13. A process for manufacturing a semiconductor integrated circuit device as claimed in claim 9 where in the step of thinning the substrate, the substrate is thinned by removing the substrate material by mirror polishing by chemical mechanical polishing.

14. A process for manufacturing a semiconductor integrated circuit device as claimed in claim 1 where the substrate is thinned to a thickness suitable for packaging, by treating the substrate surface opposite to the surface on which a device structure is formed, thus eliminating the need to adjust substrate thickness before packaging.

15. A process for manufacturing a semiconductor integrated circuit device as claimed in claim 9 where the substrate is thinned by treating the substrate surface opposite to the surface on which a device structure is formed, to eliminate a step of grinding for adjusting a substrate thickness before packaging.

16. A process for manufacturing a semiconductor integrated circuit device as claimed in claim 1 where the device structure formed on the substrate surface comprises a DRAM.

17. A process for manufacturing a semiconductor integrated circuit device as claimed in claim 9 where the device structure formed on the substrate surface comprises a DRAM.

18. A process for manufacturing a semiconductor integrated circuit device as claimed in claim 1 where the device structure formed on the substrate surface comprises a self-align contact structure using a silicon nitride film.

19. A process for manufacturing a semiconductor integrated circuit device as claimed in claim 9 where the device structure formed on the substrate surface comprises a self-align contact structure using a silicon nitride film.

* * * * *